United States Patent [19]
Pickering et al.

[11] Patent Number: 6,121,793
[45] Date of Patent: Sep. 19, 2000

[54] LOGIC DEVICE

[75] Inventors: Andrew James Pickering, Rugby; Giuseppe Surace, East Hunsbury, both of United Kingdom

[73] Assignee: Phoenix VLSI Consultants LTD., Northamtonshire, United Kingdom

[21] Appl. No.: 09/070,758

[22] Filed: Apr. 30, 1998

[30] Foreign Application Priority Data

Apr. 30, 1997 [GB] United Kingdom .................. 9708865

[51] Int. Cl.$^7$ ............................................. H03K 19/0185
[52] U.S. Cl. ........................ 326/73; 326/121; 326/115
[58] Field of Search .................. 326/70, 71, 73, 326/112, 115, 119, 121, 126

[56] References Cited

U.S. PATENT DOCUMENTS

| | | | |
|---|---|---|---|
| 4,728,900 | 3/1988 | Nakagawara et al. | 327/52 |
| 4,779,016 | 10/1988 | Sugiyama et al. | 326/66 |
| 4,806,796 | 2/1989 | Bushey et al. | 326/126 |
| 5,148,061 | 9/1992 | Hsueh et al. | |
| 5,149,992 | 9/1992 | Allstot et al. | 326/115 |
| 5,317,214 | 5/1994 | Lewis | |
| 5,818,269 | 10/1998 | Brown et al. | 327/108 |
| 5,877,642 | 3/1999 | Takahashi | 326/126 |

FOREIGN PATENT DOCUMENTS

| | | |
|---|---|---|
| 0 584 946 A2 | 3/1994 | European Pat. Off. |
| 0 642 226 A2 | 3/1995 | European Pat. Off. |

OTHER PUBLICATIONS

"Performance of ECL–Compatible 75 Line Driver/Receiver Realised INA 1.2 UM CMOS Technology" Electronics Letters, Sevenhans J. et al. vol. 26, No. 11, May 24, 1990, pp. 764–766.

"ECL–CMOS and CMOS–ECL Interface in 1.2–UM CMOS for 150–MHZ Digital ECL Data Transmission Systems" Steyaert M S J et al., IEEE Journal of Solid–State Circuits, vol. 26, No. 1, Jan. 1, 1991, pp. 18–23.

*Primary Examiner*—Michael Tokar
*Assistant Examiner*—Don Phu Le
*Attorney, Agent, or Firm*—Dykema Gossett, PLLC

[57] ABSTRACT

A symmetrical loading and current supply arrangement is described for a differential-type logic means, and symmetrical voltage swings are thereby achieved in the logic output. In a preferred arrangement the output voltages are self-aligned to a CMOS level which facilitate conversion of the differential-type output to CMOS signals.

19 Claims, 6 Drawing Sheets

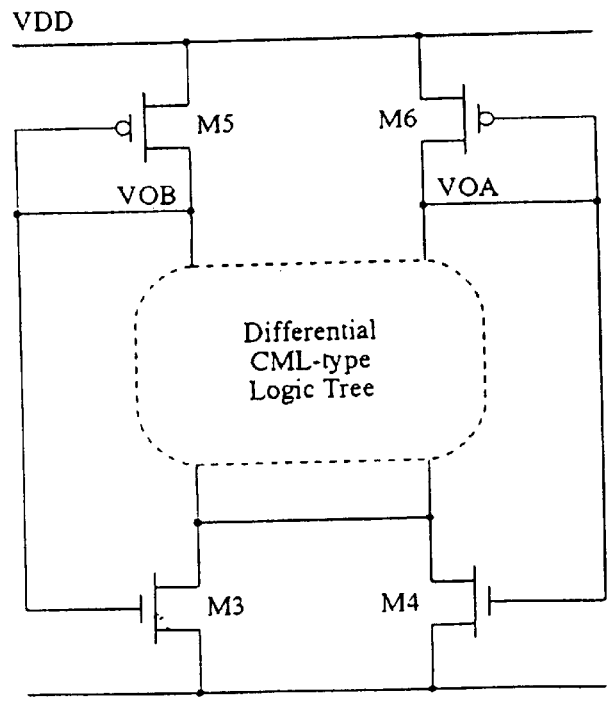
FIG. 7
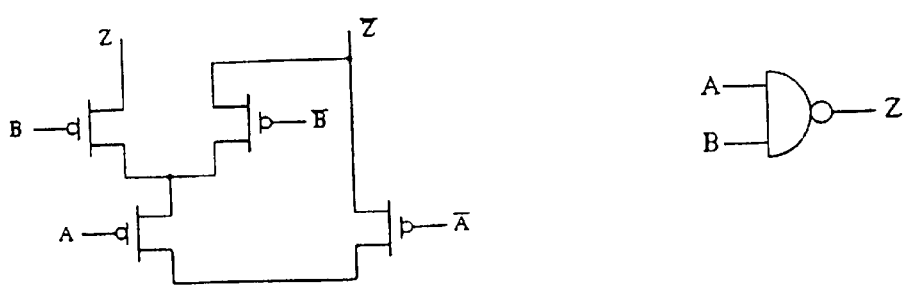
FIG. 8A
FIG. 8B

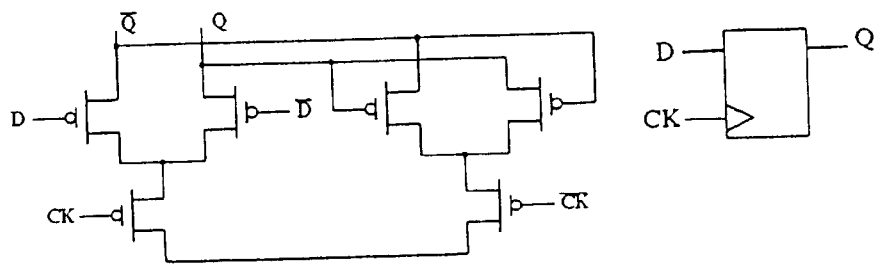
FIG. 9A
FIG. 9B
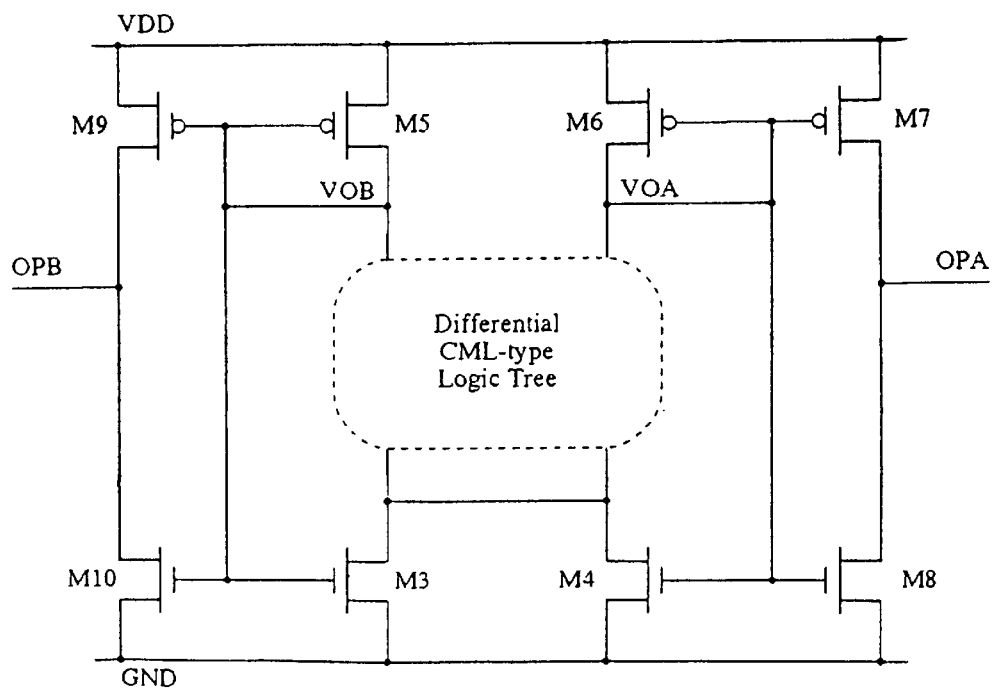
FIG. 10

LOGIC DEVICE

BACKGROUND OF THE INVENTION

1. Field of the Invention

The present invention relates to a device for handling electronic signals of the type in which the signal level is represented by the difference between two input signals such that a well balanced output is achieved. This is useful in conversion to circuitry in which the signal level is represented by the absolute value of a signal with reference to power supply lines, and also for providing inputs to further differential type circuitry.

2. The Prior Art

In recent years there has been an increasing use of mixed bipolar/CMOS technologies in silicon integrated circuit design and manufacture. Also, the requirement for increased speed performance has led to the adoption of differential-type logic in some CMOS-only devices. (Current-mode logic (CML) and Emitter coupled logic (ECL) are both logic types in which a signal value is not represented by the absolute signal band on one line but rather by the difference, or the polarity of the difference, between the signal levels on a pair of lines. The term "differential-type logic" is used herein to refer to such arrangements.) In both of these cases there arises the need to convert the low-level differential signal from the differential-type logic into a full rail-to-rail signal for use with standard CMOS logic.

FIG. 1 is a schematic diagram of one previously known circuit for performing this type of conversion. The circuitry in FIG. 1 consists of a differential amplifier (Q1, Q2) with diode-connected PMOS loads (M1, M2). The differential input to the circuit (IPA, IPB) creates a current difference in the two PMOS loads which is mirrored in the second stage PMOS devices (M3, M5). The second stage uses a NMOS current mirror (M4, M6) as an active load to produce a large voltage swing at the circuit output (OPA). This circuit produces virtually a full rail-to rail signal at its output. However, the symmetry of the rising and falling output voltages tends to be poor due to the intrinsic asymmetry of the second stage: in effect the first stage differential amplifier output pulls OPA high through a single transistor (M5), whereas the pull-down is effected via three transistors (M3, M4 and M6).

An alternative design is shown in FIG. 2 and is based on a self-biased differential amplifier consisting of a differential pair (M1, M2) which uses a standard PMOS current mirror load (M5, M6). This current mirror bias voltage (VOB) is also used to set the operating current for this stage by controlling the gate of the two parallel current source transistors (M3, M4). The input stage generates a reasonably large swing at its output (VOA) which can then be applied directly to a CMOS inverter (M7, M8) to get a true CMOS level output (OPA). One advantage of this circuit is that by ratioing the gains of the devices such that:

$\beta_{M1}=\beta_{M2}$
$\beta_{M5}=\beta_{M6}=K\beta_{M7}$
$\beta_{M3}=\beta_{M4}=K\beta_{M8}$ the balance point of the differential amplifier stage can be made equal to the switching voltage of the output inverter. This consequently gives very good sensitivity to small signals. However, the signal swing of VOA around the balance point is rather asymmetrical and hence does not give well-balanced rise and fall times.

As mentioned, both of these two known converter circuits do not have good symmetry, that is the times taken to perform the two directions of switching operation differ, and this may mean that these converter devices cannot be used in situations where symmetry is important, for instance, in circuits where the timing of various signals is critical.

In differential-type logic circuits it is well known also to provide logic trees or arrays of transistors arranged to implement a defined logic function by combining one or more inputs to give an output. That output may be passed to further differential-type circuitry and for the best functioning of that further circuitry it is also important that the positive-going and negative-going transitions are symmetrical.

Alternatively the output from the logic function may require conversion to CMOS type signals and again, for the reasons discussed above, symmetry in the output is important.

SUMMARY OF THE INVENTION

The present invention provides a circuit loading and current supply arrangement for a differential-type logic arrangement which is symmetrical with regard to the two output points of a differential signal output from said logic whereby positive-going and negative-going transitions in the output signal are symmetrical with each other.

In a preferred arrangement two identical loading elements are connected between a first power supply line and said output points respectively and two identical current source elements in the form of transistor devices are connected in parallel between the logic and a second power supply line, signals from the two output points being applied as control signals to said two transistor devices respectively. Preferably in this arrangement the loading elements are also transistor devices, in which case inverted forms of said signals from the two output points are applied as control signals to these transistor devices respectively, although they may simply be passive loads such as resistor elements.

In the invention, the differential-type logic arrangement may be any suitable logic tree performing operations on input signals. Exemplary arrangements will be described later which function as a 2-input NAND gate and a D-type latch but these are not limiting.

Alternatively the logic arrangement may be an inverting or non-inverting gate and such can be incorporated into an arrangement for simply converting logic signals between differential-type logic and other logic such as CMOS type.

In particular an embodiment of the present invention provides circuitry for converting between differential signals and CMOS type signals in which the circuit elements are also arranged symmetrically with regard to the input points of the differential signals. This overall symmetry in the circuit design and thus the signal swings in the output provides considerable advantages over the known converter circuits described above.

While the present invention is particularly suited to use in CML/CMOS designs, an embodiment will be illustrated later in which the principle of this invention is applied to technologies lacking complementary transistor types.

The design of the circuit in the present invention also enables a complementary output to be simply obtained such as was not possible in the prior art.

The invention thus provides a new circuit design having improved symmetry such that it is of wider useful application.

BRIEF DESCRIPTION OF THE DRAWINGS

The present will be better understood from the following description of preferred embodiments, given by way of example and with reference to the accompanying drawings in which:

FIG. 7 is a schematic representation of a third embodiment of this invention;

FIGS. 8A, 8B and 9A, 9B are illustrations of the logic which may be implemented in the embodiment of FIG. 7; and FIG. 10 is a schematic representation of a fourth embodiment of this invention.

DETAILED DESCRIPTION OF THE DRAWINGS

In broad terms, a symmetrical loading and current supply arrangement is described for a differential-type logic means, and symmetrical voltage swings are thereby achieved in the logic output. In a preferred arrangement the output voltages are self-aligned to a CMOS level which facilitate conversion of the differential-type output to CMOS signals.

Figure 3:
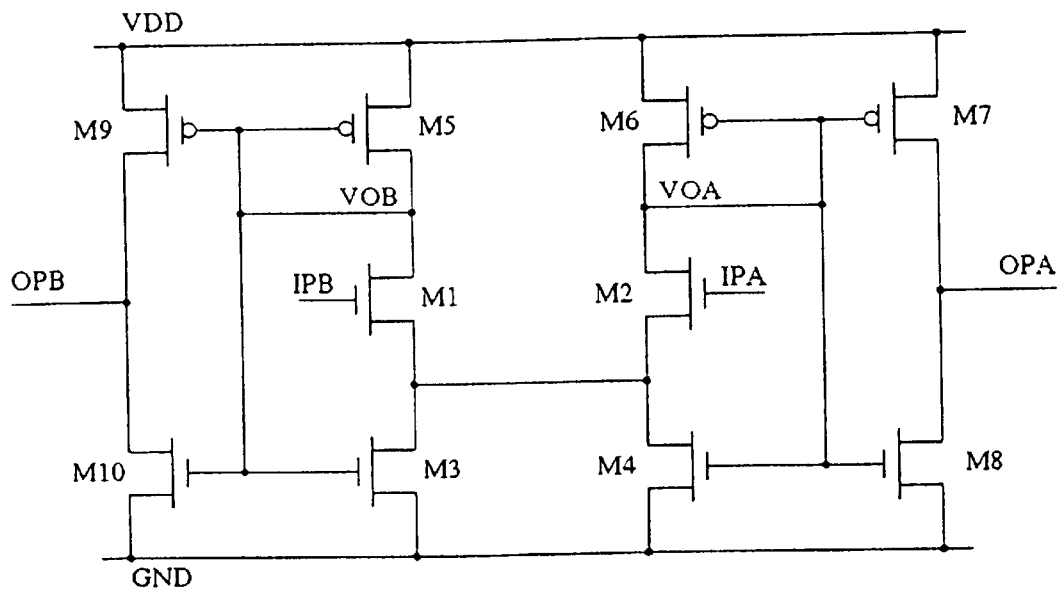
FIG. 3 is a schematic representation of an ECL-CMOS convertor according to a first preferred embodiment of the present invention.

FIG. 3 illustrates a schematic representation of the first preferred embodiment of this invention which is a differential-type signal to CMOS converter. In this embodiment, the central logic function is a simple input gate formed by transistors M1, M2, while transistors M3, M4, M5 and M6 provide the symmetrical loading and supply arrangement which ensure symmetry in the output signals VOA, VOB.

As can be seen in FIG. 3, transistors M3, M4 are connected in parallel between the ground line and the input logic gate having their gates connected respectively to outputs VOB, VOA. Transistors M5, M6 are connected between the positive power line VDD and the two output points VOA, VOB respectively, with these signals also being inverted and applied to the gates of these transistors.

Figure 2:
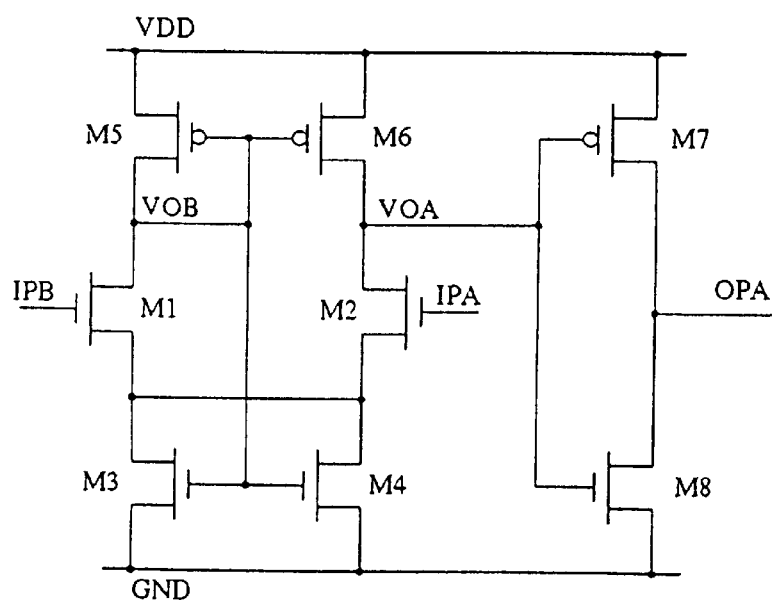
FIG. 2 is a schematic diagram illustrating a known ECL-CMOS convertor based on a self-biased differential amplifier.

It will be seen that this part of FIG. 3, comprising transistors M1–M6, is similar to the self-biased amplifier of FIG. 2. However, the gate bias voltage for M4 and M6 is taken from VOA, rather than VOB in FIG. 2 and this has a profound effect on the circuit's operation as compared with FIG. 2. As can be seen from FIG. 3, this change means that the circuit elements of the input stage are arranged symmetrically with respect to the input points of IPA and IPB.

With this circuit, the voltage swing at VOA is reduced as compared with FIG. 2, and this might be considered to be counterproductive. However, although the signal swing is smaller, it is more symmetrical, and when the correct device ratios are maintained (as described above), the swing is perfectly centred around the switching voltage of the output inverter comprising transistors M7, M8. If the PMOS and NMOS devices are given similar drive strengths, then high speed performance is obtained with very good symmetry of rising and falling edges at the output.

A further development is also shown in FIG. 3. An extra CMOS inverter output stage (M9, M10) is provided to provide a well-aligned complementary output signal. This feature is not available with either of the converter circuits shown in FIGS. 1 and 2.

Figure 1:
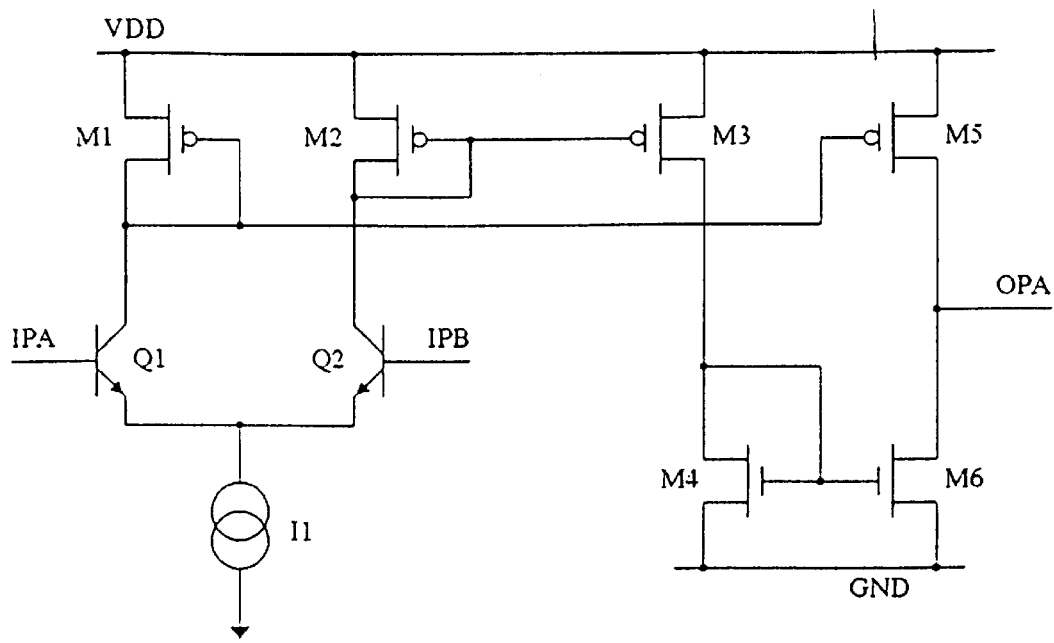
FIG. 1 is a schematic representation of a standard ECL-CMOS convertor based on current mirrors.

The change of the gate bias voltage for M6 effectively creates a differential amplifier with two diode-connected PMOS loads, which is in some ways similar to FIG. 1. However, the alteration for M4, such that the differential amplifier current source is split into two separate devices, each biased from one of the output loads is also significant in this arrangement. In some ways, this circuit design goes against common sense logic, since it actually gives a reduced gain on the input stage. However, there are significant advantages in terms of symmetry, and the reduced gain is not of great significance given the presence of the output inverter stage.

Figure 4:
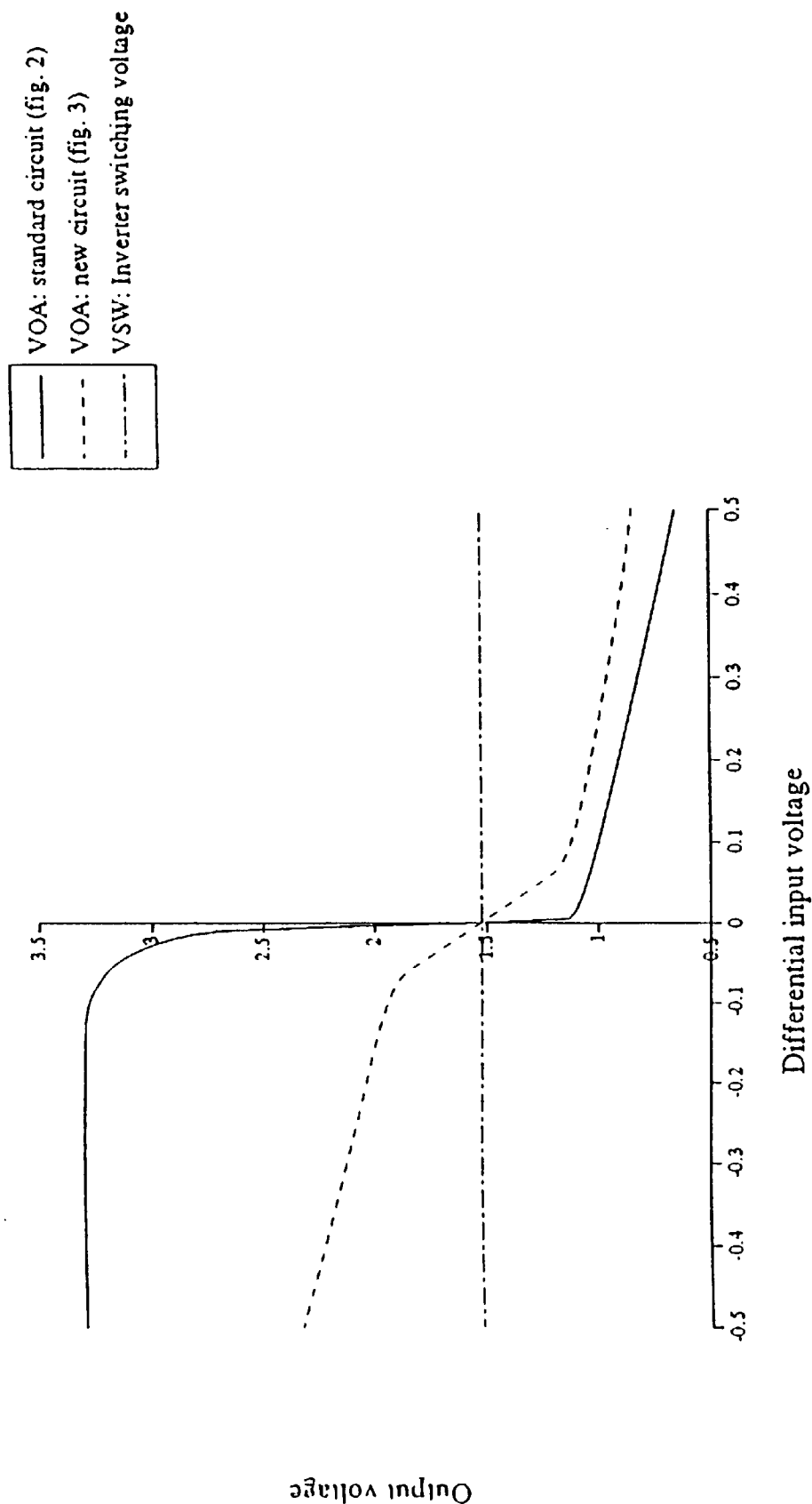
FIGS. 4 and 5 are graphs illustrating the output of the circuit represented in FIG. 3 to illustrate the performance of the first embodiment of the present invention.

FIG. 4 illustrates the variation of the voltage at VOA in FIGS. 2 and 3 with differential input voltage, for both the standard and modified differential amplifiers. The better symmetry in FIG. 3 is quite evident.

Figure 5:
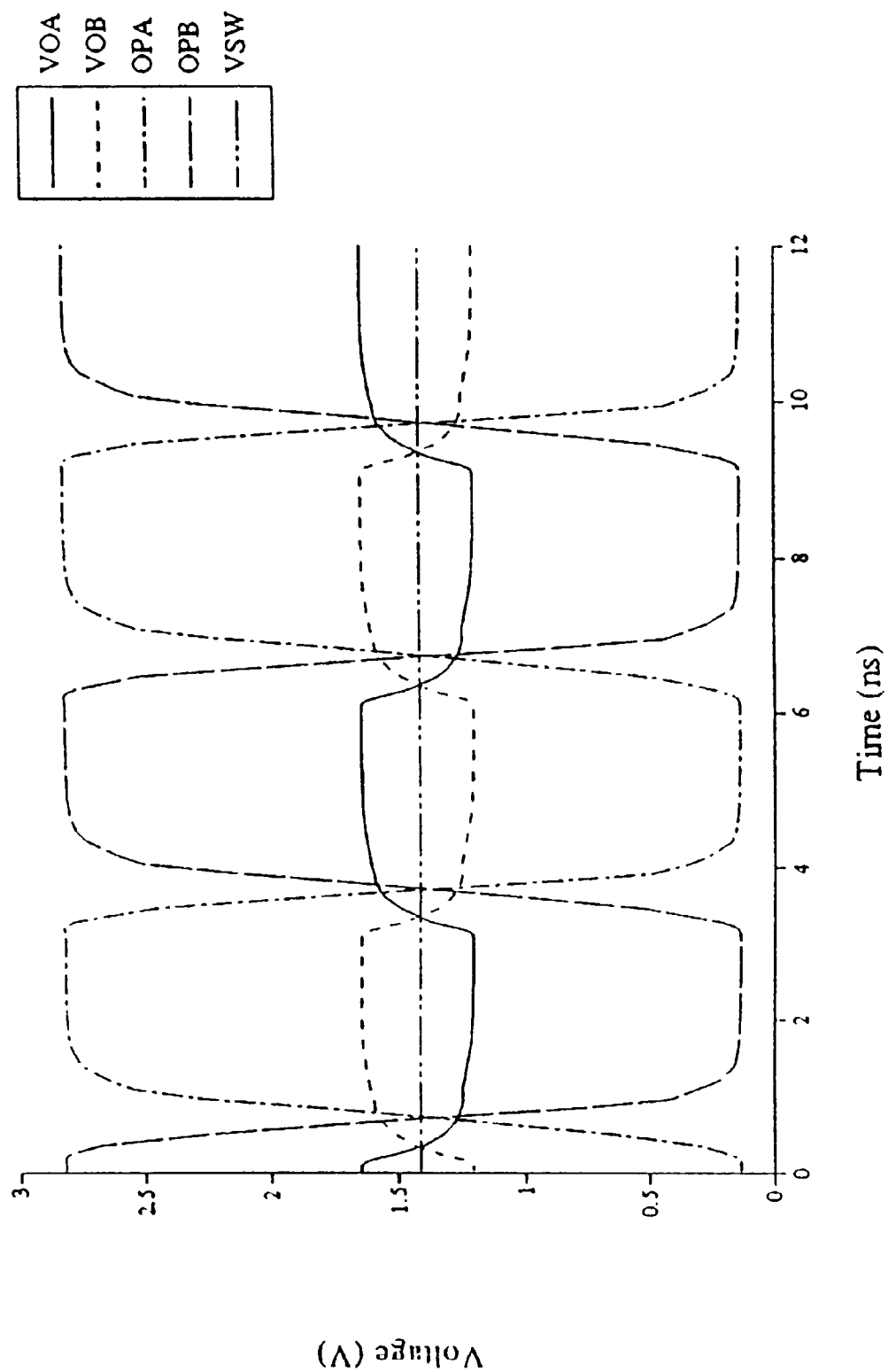

Results of a transient simulation are shown in FIG. 5. This simulation was carried out with a 100 mV differential voltage signal at the circuit input, with a common-mode level of 1.8V, and a 3.0V supply rail.

The circuit has been described above with an NMOS input differential amplifier, NMOS current source devices and PMOS loads. As is well known a complementary version of this circuit may simply be constructed with these device types swapped over.

Another variation on the illustrated circuit would be the substitution of the differential pair transistors (M1, M2) with bipolar devices. This would only be possible if the common-mode input voltage and supply voltage for the intended application were amenable.

Figure 6:
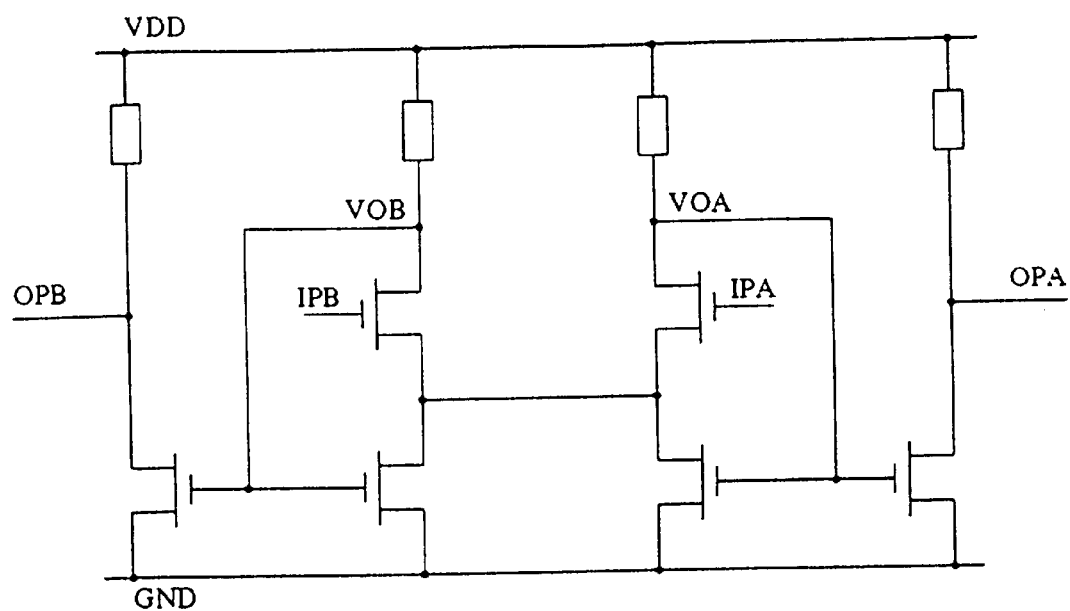
FIG. 6 is a schematic representation of a second embodiment of this invention.

As mentioned above, an important aspect of the illustrated circuit is the derivation of the current source bias voltages from the output voltage on the differential amplifier loads. This same principle may be applied to a design using, for example, simple passive loads rather than PMOS transistors, as shown in FIG. 6. The technique is thus also applicable to technologies lacking complementary transistor types.

This circuit is useful for the conversion of small-signal differential type logic signals into full-swing CMOS on chips with mixed logic types. Another ideal use for this circuit is as a differential input receiver cell. For this, the circuit can be used in either a differential or a single-ended configuration with a reference level applied to the second amplifier input.

FIG. 7 illustrates a schematic diagram of a third embodiment of the present invention in which a general differential type logic tree has been substituted for the input gate formed by transistors M1 and M2 in the circuit of FIG. 3, and also transistors M7, M8, M9, M10 are omitted. The central logic tree is provided with load and supply devices M3, M4, M5, M6 in a symmetrical fashion the same as in FIG. 3 and therefore the output of the logic tree represented by the differential signals VOA, VOB have symmetrical voltage swings during their switching. The symmetrical nature of these swings makes the signal suitable for use in further differential type circuity, in particular in circuitry which is particularly sensitive to the timings of the transitions between the two states of the differential signal, and it will be understood that this invention is achieved by the symmetrical loading and supply arrangement. Also, as will be described later, the signals produced are suitable for driving CMOS circuitry directly.

FIGS. 8 and 9 illustrate the examples of the differential logic trees which may be used in the circuit of FIG. 7.

FIGS. 8A and 8B illustrate the construction of a 2-input NAND gate which may be used in this invention. FIG. 8a illustrates a particular configuration of transistors which is arranged to achieve the desired logic function while FIG. 8b is a diagrammatic representation of the logic function. It will be understood that, in FIG. 8a, as in the previous diagrams, where a signal is shown as being applied via a small circle, this is indicative, according to normal convention, of an inverted form of the function being applied.

As mentioned, the circuitry illustrated in FIG. 8a can be substituted into the centre of FIG. 7 and in particular the differential output Z and $\bar{Z}$ is connected to outputs VOB, VOA and with the bottom of the transistors taking input A being connected to transistors M3, M4.

FIGS. 9A and 9B illustrate the configuration of a D-type latch which may be substituted into FIG. 7. In particular, FIG. 9a illustrates the configuration of a plurality of transistors so as to achieve this function while FIG. 9b again gives the equivalent logic diagram. For substitution into FIG. 7, differential output Q, $\bar{Q}$ corresponds to outputs VOA, VOB and the bottom end of the transistors taking the clock input is connected to transistors M3, M4.

The use of the circuit of FIG. 7 to take the outputs from the circuits of FIGS. 8A, 8B and 9A, 9B ensures that the swings in the outputs Z and Q respectively are symmetrical about the centre point.

The above-described embodiments can be combined as illustrated in FIG. 10 to provide the combined function of a defined logic tree implemented in differential circuitry and providing a CMOS type output. It will be seen that FIG. 10 is broadly similar to FIG. 7 with the addition of transistors M7 to M10 as in FIG. 2 to provide the CMOS output. The voltage swings at the differential stage outputs (VOA, VOB) are then centred on the CMOS inverter switching point set by the drive ratios of M3 to M6.

This combination of a logic function implemented in differential circuitry and a CMOS output has particular advantages in that it can take advantage of the different characteristics of these two types of circuitry.

In particular the differential circuitry can be used to implement logic functions requiring high speed, although at the expense of power consumption, in situations where only small voltage swings are available, for instance at chip inputs, and in situations requiring a low power supply noise as the differential logic uses a virtually constant current. The outputs can then be converted to CMOS which can be used for the less speed critical logic in which circumstances the CMOS circuitry has the advantages of low power consumption and high pack intensity.

A particular example of this might be the input stage of a chip receiving small signal differential serial data at a higher rate than can be handled easily by standard logic. Such a situation may arise for instance in communications applications where fibre channels may be operating at 1 Gbps or in low voltage differential signal applications which are known to operate up to 622 Mbps. In such applications high speed differential logic based on the circuits discussed above may be used to buffer, latch and de-multiplex received signals to produce parallel data stream operating at a lower rate. This may be output as CMOS levels for further processing using standard logic.

What is claimed is:

1. A logic device comprising:
   logic circuit means arranged to receive at least one signal input in the form of a differential signal in which the signal level is represented by a difference between two signal lines, to perform a logic function on said at least one signal input and to provide an output differential signal representing the result of said logic function on two output signal lines; and
   loading and current source means arranged to connect said logic circuit means to a power supply, said loading and current source means comprises a pair of loading elements connected respectively between a first power supply line and said output signal lines respectively and a pair of current source devices in the form of transistor devices connected in parallel between the logic circuit means and a second power supply line and having signals appearing at said output lines applied as control signals to the two transistor devices respectively, said loading and current source means being symmetrical with regard to said output signal lines whereby the voltage-time characteristics of said output differential signals for positive- and negative-going transitions are substantially symmetrical.

2. A logic device according to claim 1 further comprising output means arranged to convert the signal on at least one of said two output lines to a signal level substantially that of one or other of said power supply lines according to the result of said logic function.

3. A logic device according to claim 1 in which said loading elements are further transistor devices having inverted forms of said signals appearing at said output lines applied as control signals respectively.

4. A logic device according to claim 1 in which said loading elements are resistive elements.

5. A logic device according to claim 1 in which said logic function is either an inverting or non-inverting gate function.

6. A logic device according to claim 1 in which said logic circuit means has at least two input signals and said logic function is one of a NAND, AND, OR, NOR and EXOR functions.

7. A logic device according to claim 1 in which said logic circuit means has a data input and a clock input and said logic function is a latch function.

8. A logic device according to claim 1 further comprising means arranged to convert said output differential signal to be a single line signal.

9. A logic device according to claim 2 in which said output means comprises, for the or each signal to be converted, two further transistor devices in series between said two power supply lines, the two further transistor devices having applied thereto as control signals the signal on said output line and an inverted version thereof respectively.

10. A logic device comprising:
    logic circuit means arranged to receive at least one signal input in the form of a differential signal in which the signal level is represented by a difference between two signal lines, to perform a logic function on said at least one signal input, and to provide an output differential signal representing the result of said logic function on two output signal lines; and
    loading and current source means arranged to connect said logic circuit means to a power supply, said loading and current source means being symmetrical with regard to said output signal lines and receiving bias signals derived from said output signal lines whereby the voltage-time characteristics of said output differential signals for positive- and negative-going transitions are substantially symmetrical.

11. A logic device according to claim 10, further comprising means arranged to convert said output differential signal to be a single line signal.

12. A logic device according to claim 10, in which said loading and current source means comprises a pair of loading elements connected between a first power supply line and said output signal lines respectively and a pair of current source devices in the form of transistor devices connected in parallel between the logic circuit means and a second power supply line and having signals appearing at said output lines applied as control signals to the two transistor devices respectively.

13. A logic device according to claim 12, in which said loading elements are further transistor devices having inverted forms of said signals appearing at said output lines applied as control signals respectively.

14. A logic device according to claim 12, in which said loading elements are resistive elements.

15. A logic device according to claim 10, in which said logic function is either an inverting or non-inverting gate function.

16. A logic device according to claim 10, in which said logic circuit means has at least two input signals and said logic function is one of a NAND, AND, OR, NOR and EXOR functions.

17. A logic device according to claim 10, in which said logic circuit means has a data input and a clock input and said logic function is a latch function.

18. A logic device according to claim 12, further comprising output means arranged to convert the signal on at least one of said two output lines to a signal level substantially that of one or other of said power supply lines according to the result of said logic function.

19. A logic device according to claim 18, in which said output means comprises, for the or each signal to be converted, two further transistor devices in series between said two power supply lines, the two further transistor devices having applied thereto as control signals the signal on said output line and an inverted version thereof respectively.

* * * * *